United States Patent [19]

Jaecklin et al.

[11] 4,053,921
[45] Oct. 11, 1977

[54] SEMICONDUCTOR COMPONENT HAVING EMITTER SHORT CIRCUITS

[75] Inventors: André Jaecklin, Ennetbaden; Thomas Vlasak, Birr, both of Switzerland

[73] Assignee: BBC Brown Boveri & Company Limited, Baden, Switzerland

[21] Appl. No.: 622,496

[22] Filed: Oct. 15, 1975

[30] Foreign Application Priority Data

Dec. 3, 1974 Switzerland ............... 16055/74

[51] Int. Cl.² ............... H01L 29/74; H01L 29/747
[52] U.S. Cl. ............... 357/38; 357/39; 357/86; 357/88
[58] Field of Search ............... 357/38, 39, 86, 88

[56] References Cited

U.S. PATENT DOCUMENTS

| | | | |
|---|---|---|---|
| 3,531,697 | 9/1970 | Muller et al. | 357/86 |
| 3,599,061 | 10/1971 | Kokosa | 357/86 |
| 3,634,739 | 1/1972 | Borchert | 357/86 |
| 3,725,753 | 4/1973 | Garrett | 357/86 |
| 3,758,832 | 9/1973 | Piatzoder | 357/86 |
| 3,812,519 | 5/1974 | Nakamura et al. | 357/60 |
| 3,893,153 | 7/1975 | Page et al. | 357/86 |

FOREIGN PATENT DOCUMENTS

2,247,006  5/1974  Germany ............... 357/38

OTHER PUBLICATIONS

Asymmetrical Silicon Control Rectifiers; by Henri Digneffe; pp. 30-34; New Electronics.
RCA Engineer vol. 19, No. 3 Oct./Nov. 1973; by Greenberg pp. 86 to 88; Reverse-Conducting Thyristor.

Primary Examiner—Andrew J. James
Attorney, Agent, or Firm—Orville N. Greene; Frank L. Durr

[57] ABSTRACT

A semiconductor component, preferably a thyristor, having emitter short-circuits in the cathode space. The emitter short-circuits are preferably arranged in a uniform fashion about the cathode space and, when formed of a material having <111> oriented crystals are arranged in ternary symmetry about the cathode or in multiples of three. In the case of material having <001> oriented crystals the emitter short-circuits are arranged in a quarternary symmetry or in multiples of four.

7 Claims, 2 Drawing Figures

SEMICONDUCTOR COMPONENT HAVING EMITTER SHORT CIRCUITS

BACKGROUND OF THE INVENTION

The invention refers to a semiconductor component, in particular a thyristor, having emitter short-circuits in the cathode space.

The employment of emitter short-circuits is known in the case of thyristors for prevention of undesirable ignition in the case of a steep rise in the anode voltage (dv/dt — ignition). It is moreover known that, during the load-like critical phase directly after ignition has resulted, these emitter short-circuits inhibit spreading of the ignition spot (H. Yamasaki — "Experimental Observation of the Plasma Propagation in a Thyristor", appearing soon in IEEE Transactions on Electronic Devices).

There also exists a first proposal according to which, in spite of the employment of emitter short circuits, spreading of the ignition does not get inhibited (Swiss Pat. No. 552,283). In accordance with this proposal a circular emitter short-circuit is provided around the ignition electrode (gate). This short-circuit ring certainly confers potential advantages, yet in the case of employment of the technology in use at present, it can lead to intolerably high ignition currents.

As was further observed, in the case of a steep rise of current in components fabricated from a homogeneous material or crystal structure, current paths form in special crystal directions (P. Voss — "Observation of the Initial Phases of Thyristor Turn-On", Solid State Electronics, 17, pages 1087–1090, 1974). The occurrence of local momentarily strongly heated points has also been detected. Such local heating, however, shows a serious defect; and, whenever it occurs, safe, reliable operation of the component is open to question.

BRIEF DESCRIPTION OF THE INVENTION

One object of this invention is to avoid the disadvantages of known devices and, in particular, to create a solid state component which allows the safe control of the ignition current in critical ranges. This is achieved in accordance with the invention if the metallization edge of the cathode (the emitter) is positioned adjacent to the control resp. ignition electrode (gate) and extends along an arc of a circle and a number of emitter short-circuits is provided, which reach up to or a little beyond this edge.

BRIEF DESCRIPTION OF THE FIGURES

The invention may now be explained in greater detail with the aid of the accompanying figures, in which.

DETAILED DESCRIPTION OF THE INVENTION

Figure 1:
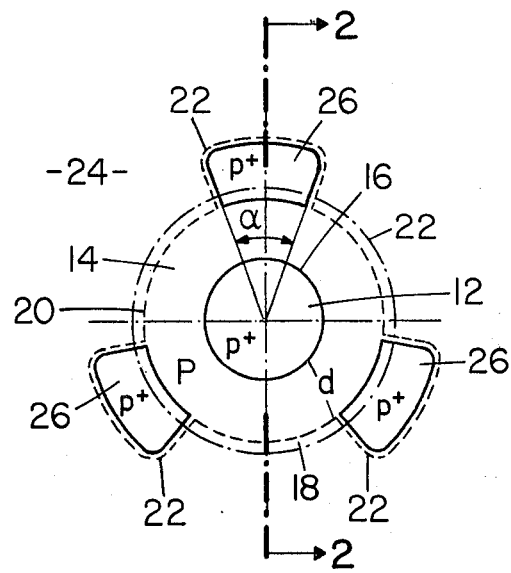
FIG. 1 shows a plan view of a semiconductor component according to the present invention.
Figure 2:
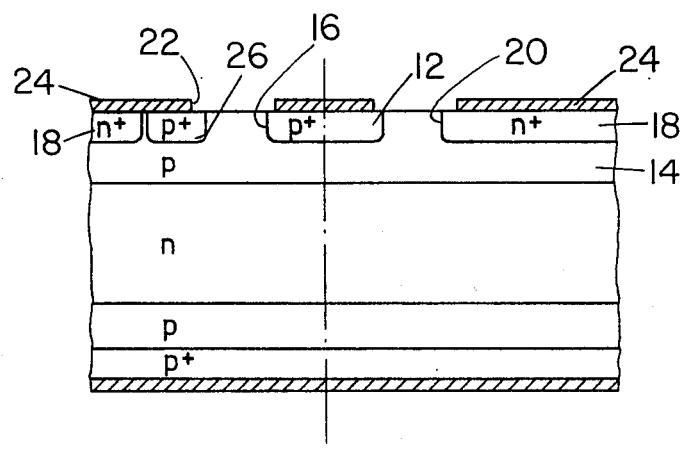
FIG. 2 shows a sectional view of FIG. 1 looking in the direction of arrows 2—2.

FIG. 1 shows the gate (ignition electrode) space of a controllable semiconductor component 10, for example, a thyristor. FIG. 2 shows a side elevation of the device of FIG. 1, that is, a section along the line 2—2 of FIG. 1. A gate (the ignition electrode) 12 in the form of a centrally located circular-shaped zone, is highly p-doped ($p+$). The gate 12 is embedded in a p-layer 14 which exhibits a corresponding recess. A distance $d$ away from the edge 16 of gate 12 is the start of an annular zone or cathode 18 of highly doped n-material ($n+$). The zone between the gate and the edge of the $n+$-region is often also designated the edge 16 of "gate 12 ditch".

In FIG. 1 the edge 16 of the $p+$ short circuit elements 26 are indicated by a solid line, the edge 20 of the $n+$ cathode 18 by a broken line. The circular edge 22 of the cathode metallization 24 is positioned just outside of the edge 20 of the $n+$ cathode 18.

In accordance with the concept of the invention, a number of emitter short-circuits are provided close to the gate 14, which extend up to the metallization edge 22 of the cathode or slightly beyond. In FIG. 1 there are three short-circuit elements 26 offset at 120° intervals, all of which reach over the metallization edge 22. The short-circuit elements 26 may be constructed as outlined in FIGS. 1 and 2, i.e., be embedded just like the gate 12 in the p-layer 14 (FIG. 2). They are also adapted to the gate 12 with regard to type of conduction and doping, i.e., in the example illustrated they are highly p-doped. The element 26 is in each case galvanically connected by the conductive cathode metallization 24 (FIG. 2), to the $n+$ cathode 18 whereby the short-circuit is effected.

The emitter short-circuits shown in FIG. 1, which occupy a special position, have naturally nothing to do with other emitter short-circuits which in the case of the semiconductor element are distributed, in known manner and for the usual purpose, over the cathode. The relative portion of the proposed emitter short-circuit along the circular cathode metallization edge 22 confers a new degree of freedom (angle $\alpha$ in FIG. 1) with which the critical ignition current can be adjusted independently of the remaining emitter short-circuits.

The emitter short-circuits at the edge of the cathode 18 should preferably be so arranged that hotspots (see above) are avoided. This can be effected by a ternary symmetry of the short-circuits in the case of $<1,1,1>$ orientated crystals or a quaternary symmetry in the case of $<0,0,1>$ orientated crystals.

In the case, most frequent occurring in practice, of $<1,1,1>$ material, advantageously three short-circuits (FIG. 1) are deposited in the directions $<1,1,2>$, $<1,2,1>$ and $<2,1,1>$. The number of short-circuits can just as well amount to multiples of 3, especially since secondary ignition channels by means of recombination radiation are observed, which exhibit a sixfold symmetry.

It is desirable to coordinate the geometrical arrangement of the short-circuits at the edge of the cathode with that of the usual short-circuits distributed across the cathode 18 (this kind of "shunt" distribution is found, e.g., in the article by Ch. Chu — "Geometry of Thyristor Cathode Shunts" in the IEEE Transactions on Electronic Devices ED-17 pages 687–690 (1970) ).

This proposed concept has no connection of any kind with other known proposals, e.g., such as depend on the geometrical fashioning of gate and/or cathode (Swiss Pat. No. 552,284 or U.S. Pat. No. 3,586,927 respectively).

Nor do any points of contact exist with the so-called "beam fired gate" ("Beam controlled ignition electrodes", see T. New, D. Cooper — "Turn-on characteristics of beam fired thyristors", IEEE, IAS-Conference, Baltimore, October 1972, pages 259–265) or with emitter short-circuits at the outer edge of the cathode (Swiss Pat. No. 536,555).

While the invention has been particularly shown and described above with reference to a preferred embodiment thereof, the foregoing and other changes in form and detail may be made therein while still remaining within the spirit and scope of the invention.

We claim:

1. A shorted emitter structure for a semiconductor device, said semiconductor device comprising:
    a wafer of semiconductor material having first and second parallel surfaces and a layer of one semiconductor material of a first conductivity type extending from said first surface;
    a center gate region of said first conductivity type generally located at the center of said first surface;
    an annular cathode region of semiconductor material of a second conductivity type extending from said first surface and surrounding and spaced from said center gate region;
    a plurality of short circuit elements comprising angular segments of said first conductivity type disposed within interior radial regions of said annular cathode region but spaced from said annular cathode region, said short circuit elements having inner diameter regions which are substantially continuous with the inner diameter of said annular cathode region; and
    an annular cathode metallizing ring which extends from about the inner diameter of said cathode region and said annular segments to about the outer diameter of said cathode region and extending across and electrically connecting said annular segments of said first conductivity type to said cathode region of said second conductivity type.

2. A semiconductor component as claimed in claim 1 wherein the geometrical arrangement of said emitter short-circuit elements at said edge of said cathode metallization is coordinated with that of the usual emitter short-circuits distributed across said cathode.

3. The structure of claim 1 wherein said layer is comprised of a p-type material; said gate and said emitter short-circuit elements are comprised of a $p+$ material; and said cathode is comprised of an $n+$ type material.

4. The component of claim 1 wherein the sides of each of said emitter short-circuuit elements are substantially radially aligned, said sides forming an angle defined by imaginary lines extending from said sides and intersecting substantially at the center of said gate;
    said angles each being adjusted to adjust the ignition current for said component.

5. A semiconductor component as claimed in claim 1, wherein said substrate has a $<1,1,1>$ oriented crystal structure and there are 3 N short circuit elements, N being an integer.

6. A semiconductor component as claimed in claim 1, wherein said substrate has a $<0,0,1>$ crystal orientation and there are 4 N short circuuit elements, N being an integer.

7. A semiconductor component as claimed in claim 5, wherein one third of said short circuit elements are deposited in the $<1,1,2>$ direction, one third of said short circuit elements are deposited in the $<1,2,1>$ direction and one third of said short circuit elements are deposited in the $<2,1,1>$ direction.

* * * * *